US006596417B1

United States Patent
Hsu et al.

(10) Patent No.: US 6,596,417 B1
(45) Date of Patent: Jul. 22, 2003

(54) MAGNETIC RECORDING MEDIUM WITH A $Ga_3Pt_5$ STRUCTURED UNDERLAYER AND A COBALT-BASED MAGNETIC LAYER

(75) Inventors: Yu-Nu Hsu, Pittsburgh, PA (US); David E. Laughlin, Pittsburgh, PA (US); David N. Lambeth, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 33 days.

(21) Appl. No.: 09/677,557

(22) Filed: Sep. 29, 2000

(51) Int. Cl.[7] .............. G11B 5/66; G11B 5/70; B05D 5/12; C23C 14/22; C23C 14/34
(52) U.S. Cl. .............. 428/694 TS; 428/611; 428/900; 427/131; 204/192.15; 204/192.2
(58) Field of Search .......... 428/694 TS, 900, 428/611; 148/429; 420/460; 204/192.15, 192.2; 427/131

(56) References Cited

U.S. PATENT DOCUMENTS

| | | | | |
|---|---|---|---|---|
| 3,615,911 A | 10/1971 | Nesbitte t al. | ........... | 148/31.57 |
| 4,287,225 A | 9/1981 | Kneller et al. | ........... | 427/48 |
| 4,560,624 A | 12/1985 | Güttner et al. | ........... | 428/632 |
| 4,642,145 A | 2/1987 | Masumoto et al. | ........ | 428/611 |
| 4,652,499 A | 3/1987 | Howard | ........... | 428/641 |
| 4,735,840 A | 4/1988 | Hedgcoth | ........... | 428/65 |
| 4,820,584 A | 4/1989 | Morita et al. | ........... | 428/336 |
| 4,833,020 A | 5/1989 | Shiroishi et al. | ........... | 428/336 |
| 4,868,070 A | 9/1989 | Nagao et al. | ........... | 428/626 |
| 4,883,711 A | 11/1989 | Shiroishi et al. | ........... | 428/336 |
| 4,902,583 A | 2/1990 | Brucker et al. | ........... | 428/665 |
| 5,057,200 A | 10/1991 | Lal et al. | ........... | 204/192.15 |
| 5,062,021 A | 10/1991 | Ranjan et al. | ........... | 360/135 |
| 5,118,564 A | 6/1992 | Shinohara et al. | ........... | 428/336 |
| 5,147,732 A | 9/1992 | Shiroishi et al. | ........... | 428/668 |
| 5,192,626 A | 3/1993 | Sekiya et al. | ........... | 428/694 |
| 5,231,294 A | 7/1993 | Takeuchi et al. | ........... | 257/28 |
| 5,314,745 A | 5/1994 | Okumura | ........... | 428/336 |
| 5,344,706 A | 9/1994 | Lambeth et al. | ........... | 428/336 |
| 5,363,794 A | 11/1994 | Lairson et al. | ........... | 117/7 |
| 5,403,547 A | 4/1995 | Smith et al. | ........... | 420/581 |
| 5,463,578 A | 10/1995 | Gambino et al. | ........... | 365/122 |
| 5,536,585 A | 7/1996 | Futamoto et al. | ........... | 428/611 |
| 5,685,958 A | 11/1997 | Futamoto et al. | ........... | 204/192.2 |
| 5,693,426 A | 12/1997 | Lee et al. | ........... | 428/611 |
| 5,723,032 A | 3/1998 | Yamaguchi et al. | ........... | 204/192.2 |
| 5,800,931 A | 9/1998 | Lee et al. | ........... | 428/611 |
| 6,159,625 A | * 12/2000 | Ueno | ........... | 428/694 T |

FOREIGN PATENT DOCUMENTS

JP          2-148411          6/1990

OTHER PUBLICATIONS

T. Kogure and S. Katayama, High–Coercivity Magnetic Hard Disks Using Glass Substrates, J. Appl. Phys. 67(9), pp. 4701–4703, May 1, 1990.

B.R. Natarajan and E.S. Murdock, Magnetic and Recording Properties of Sputtered Co–P/Cr Thin Film Media, IEEE Transactions of Magnetics, vol. 24, No. 6, pp. 2724–2726, Nov. 1998.

Jack H. Judy, Thin Film Recording Media, MRS Bulletin, pp. 63–72, Mar. 1990.

(List continued on next page.)

*Primary Examiner*—Holly Rickman
(74) *Attorney, Agent, or Firm*—Kirkpatrick & Lockhart LLP

(57) ABSTRACT

The present invention provides a longitudinal magnetic recording media having a substrate, a Co or Co alloy based magnetic layer arid an underlayer disposed between the substrate and the magnetic layer. The underlayer is made of a material having a $Ga_3Pt_5$ crystalline structure, most preferably $Ni_5Al_3$. Several intermediate layers, disposed between the underlayer and the magnetic layer may also be included.

46 Claims, 15 Drawing Sheets

$Ni_5Al_3$ (221) plane

CoCrPt (10$\bar{1}$0) plane

OTHER PUBLICATIONS

J.A. Christner et al., Low–Noise Metal Medium for High-Density Longitudinal Recording, J. Appl. Phys. 63 (8), pp. 3260–3262, Apr. 15, 1988.

Nathan R. Belk et al., Measurement of the Intrinsic Signal-To–Noise Ratio for High–Performance Rigid Recording Media, J. Appl. Phys. 59(2), pp. 557–563, Jan. 15, 1986.

J.K. Howard, Thin Films for Magnetic Recording Technology: A Review, J. Vac. Sci. Technol. A, vol. 4, No. 1, pp. 1–13, Jan./Feb. 1986.

Jacques Daval and Denis Randet, Electron Microscopy on High–Coercive–Force Co–Cr Composite Films, IEEE Transactions of Magnetics, vol. Mag.–6, No. 4, pp. 768–773, Dec. 1970.

E.Y. Chaung and W. Tang, Elimination of CFC in Thin–Film Disk Manufacturing, ACCESS Selected Topics in Storage Technology, IBM San Jose, vol. V, No. 3, pp. 1–12, Third Quarter 1991.

M. Futamoto et al., Magnetic and Recording Characteristics of Bicrystalline Longitudinal Recording Medium Formed on an MgO Single Crystal Disk Substrate, LEEE Transactions on Magnetics, vol. 30, No. 6, Nov. 1994.

R. Ranjan et al., Laser Texturing for Low–Flying–Height Media, J. Appl. Phys. 69(8), pp. 5745–5747, Apr. 15, 1991.

C.S. Barrett et al., Structure of Metals, Crystallographic Methods, Principles and Data, Third Revised Edition, pp. 272–273, 1980.

P. Villars et al., Pearson's Handbook of Crystallogrpahic Data for Intermetallic Phases, Second Edition, vol. 1, various pages, 1991.

Lee et al., NiAl Underlayers For CoCeTa Magnetic Thin Films, IEEE Transactions on Magnetics, vol. 30, No. 6, pp. 3951–3953, Nov. 1994.

Laughlin et al., Microstructural and Crystallographic Aspects of Thin Film Recording Media, IEEE Transactions on Magnetics, vol. 36, No. 1, pp 48–53, Jan. 2000.

T.B. Massalski, Binary Alloy Phase Diagrams, ASM International, 1996.

Witting et al., Chromium Segregation in CoCrTa/Cr and CoCrPt/Cr Thin Films for Longitudinal Recording Media, IEEE Transactions on Magnetics, vol. 34, No. 4, pp. 1564–1566, Jul. 1998.

Nakamura et al., Epitaxial Growth of Co/Cr Bilayer Films on MgO Single Crystal Substrates, Journal of Applied Physics, vol. 32, pt. 2, No. 10A, Oct. 1993.

W.D. Kingery et al., Introduction to Ceramic, $2^{nd}$ ed., p. 69, John Wiley & Sons, 1976.

L.V. Azaroff, Elements of X–ray Crystallography, McGraw–Hill Book Company, pp. 68–69, 1968.

David E. Laughlin and Bunsen Y. Wong, The Crystallography and Texture of Co–Based Thin Film Deposited on Cr Underlayers, IEEE Transaction on Magnetics, vol. 27, No. 6, pp. 4713–4717, Nov. 1991.

T. Yamashita et al., Sputtered $Ni_xP$ Underlayer for CoPt-Based Thin Film Magnetic Media, IEEE Transcation on Magnetics, vol. 27, No. 6, pp. 4727–4729, Nov. 1991.

K. Hono et al., Crystallography of Co/Cr Bilayer Magnetic Thin Films, J. Appl. Phys. 68(9), pp. 4734–4740, Nov. 1, 1990.

N. Tani et al., Effects of Substituted Elements into the Cr Layer on CoNiCr/Cr Sputtered Hard Disk, J. Appl. Phys. 67 (12), pp. 7507–7509, Jun. 15, 1990.

Rajiv Ranjan, Beta Tunsten Underlayer for Low–Noise Thin–Film Longitudinal Media, J. Appl. Phys. 67 (9), pp. 4698–4700, May 1, 1990.

* cited by examiner

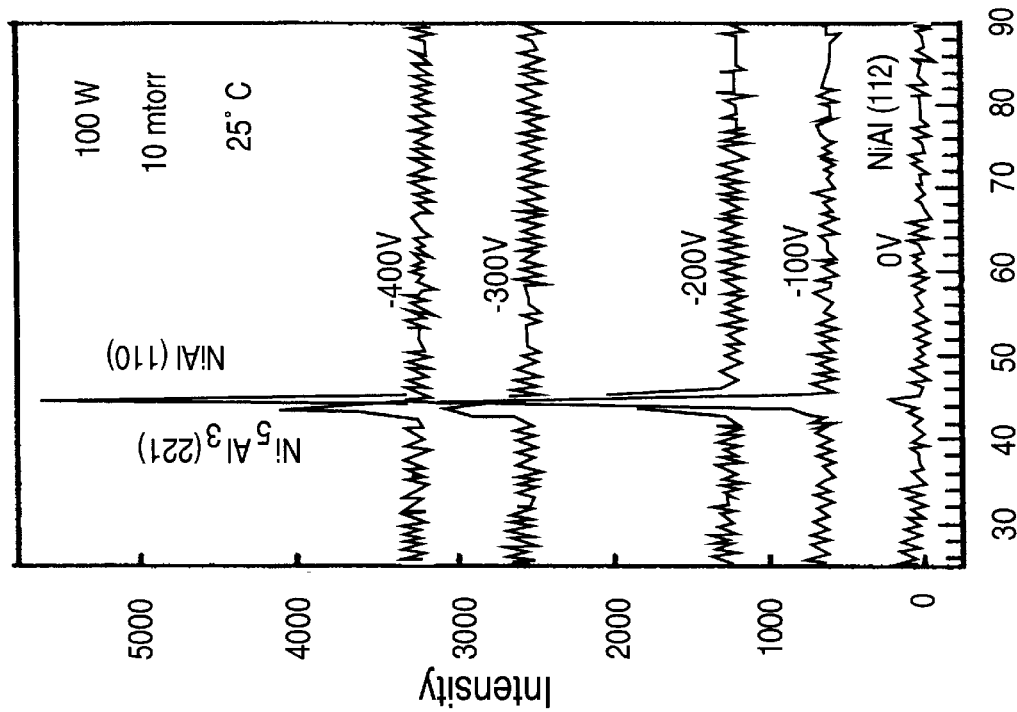
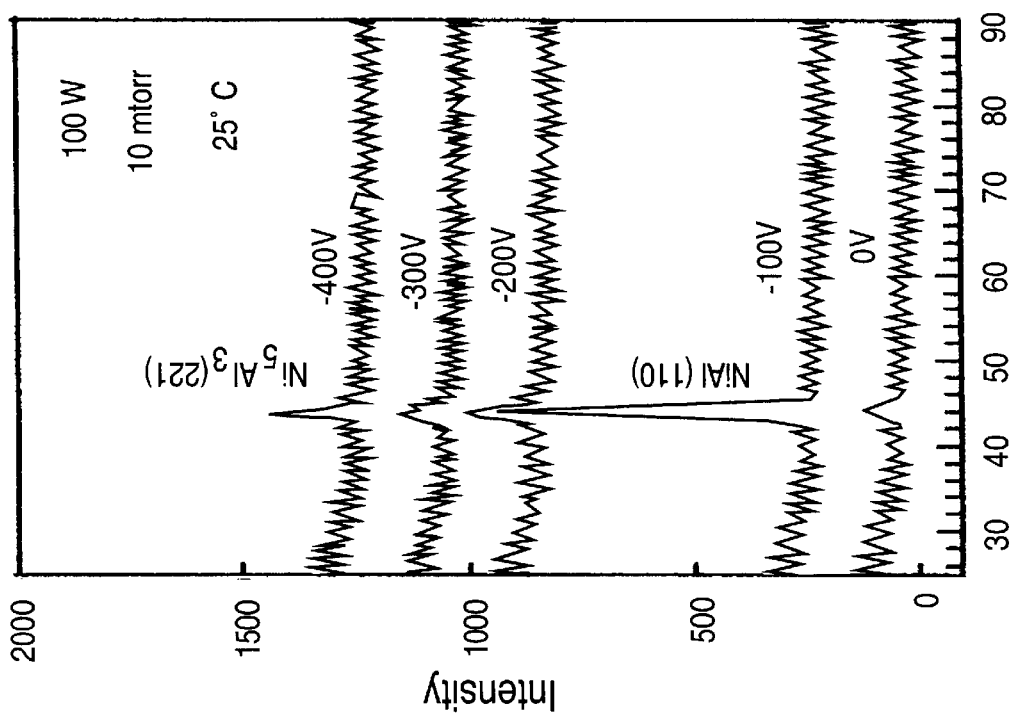
FIG. 5(b)
FIG. 5(a)

MAGNETIC RECORDING MEDIUM WITH A $Ga_3Pt_5$ STRUCTURED UNDERLAYER AND A COBALT-BASED MAGNETIC LAYER

CROSS REFERENCE TO RELATED APPLICATION

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention relates to a magnetic thin film for a magnetic recording medium, and more particularly, to $Ga_3Pt_5$ structured underlayers for use with a cobalt or cobalt based magnetic layer.

2. Description of the Invention Background

In recent years there has been an ever-increasing demand for computers with greater data storage capacity. This demand has been met by the development of computer discs, both flexible and rigid, that contain magnetic recording media with a greater magnetic recording density. Data on the discs is stored in circular tracks and divided into segments within the tracks. Disc drives typically employ one or more discs rotated on a central axis. A magnetic head is positioned over the disc surface to either access or add to the stored information. The heads for disc drives are mounted on a movable arm that carries the head in very close proximity to the disc over the various tracks and segments. The structure of disc drives is well known.

Presently, the dominant type of disk is a thin-film disk comprised of a multilayer structure that includes a substrate at the base covered by an underlayer structure, a magnetic layer structure and optionally, an overlayer at the top. The overlayer is commonly coated with an overcoat and an organic lubricant. Sometimes an intermediate layer will be placed between the underlayer structure and the magnetic layer and in addition sometimes a seed layer will be placed between the substrate and the underlayer structure. Data, in the form of magnetic bits, is stored on the magnetic layer. The magnetic layer is typically comprised of cobalt or a cobalt based alloy with a hexagonal closed packed ("HCP") structure, such as CoCrTa, CoCrPt, CoCrPtB, CoCrPtTa, and CoNiCrPt.

The microstructure of the magnetic layer is critical to achieving a high magnetic recording density. For thin film longitudinal magnetic recording media, the desired crystalline structure of the Co or Co alloy is HCP with uniaxial crystalline anisotropy and a magnetization easy direction along the c-axis, which is in the plane of the film. The better the in-plane c-axis crystallographic texture, the more suitable the Co alloy thin film is for use in longitudinal recording.

To achieve a high magnetic recording density, the magnetic layer must consist of small and isolated grains that reduce media noise. In addition, a key to increasing media recording density is to reduce transition length, which can be achieved by increasing media coercivity. High coercivity is achieved by obtaining Co grains of such crystalline perfection that the Co magneto-crystalline anisotropy is maximized and not compromised by lattice strains and defects. It is well known that, by obtaining a good Co crystallographic texture, the alignment of the Co easy axis in the film plane increases the coercivity of the media. There are two crystallographic textures that align the Co easy axis in the thin film plane, Co (1120) and Co (1010).

The desired microstructure of the magnetic layer can be achieved by manipulating the deposition process, by grooving the substrate surface, or, most commonly, by using an underlayer. It is well known that an underlayer can be used to control the texture and grain size of the magnetic layer. Various materials have been employed for use as an underlayer. In particular, for longitudinal media, NiAl, NiP, Cr and Cr alloys containing such elements as Mn, Ru, Ti, W, Mo or V have been used, although, among these materials, pure Cr and Cr alloys have been the most widely used. A Cr underlayer develops a Cr (002) texture when deposited at elevated temperatures, e.g., about 150 or 200° C., which enables epitaxial growth of the Co (1120) textured thin film.

U.S. Pat. No. 5,693,426 to Lee et al., teaches the use of a material having a B2-ordered crystalline structure, and a combined layer structure of a B2 followed by a Cr or Cr alloy, as an underlayer structure. These B2 materials include NiAl, AlCo, FeAl, FeTi, CoFe, CoTi, CoHf, CoZr, NiTi, CuBe, CuZn, AlMn, AlRe, AgMg, and $Al_2FeMn_2$. The most preferable material is NiAl. The NiAl underlayer is preferable to the Cr underlayer because the unique NiAl (112) texture can be used to induce the uni-crystal Co layer of the Co (1010) texture. In addition, the NiAl underlayer induces smaller Co grains and a "tighter" grain size distribution than can be achieved with the Cr underlayer. Both of these factors are essential to reduce media noise.

Notwithstanding the benefits achieved by the use of materials having a B2-ordered crystalline structure as an underlayer, and NiAl in particular, the NiAl (112) plane is not the lowest surface-energy plane. There is a need for recording media having even greater storage density and improved texture of NiAl.

SUMMARY OF THE INVENTION

The present invention provides an improved recording media. The recording media of the invention may be used for incorporation in a disc drive having a rotatable disc for operation in conjunction with magnetic transducing heads for the recording and reading of magnetic data. It may also be used with storage devices such as flexible magnetic discs or tapes using known flexible substrates or x-y addressable storage systems that might use ridge substrates. The novel recording media comprises a flexible or rigid substrate, a magnetic layer, preferably formed from a Co or Co alloy film, and an underlayer comprised of a material having a $Ga_3Pt_5$ structure disposed between the substrate and the magnetic layer. As used herein, $Ga_3Pt_5$ structure means a material having a crystal symmetry like that of $Ga_3Pt_5$. The $Ga_3Pt_5$ structure has orthorhombic symmetry. Materials having a $Ga_3Pt_5$ structure include $Ga_3Pt_5$, $Mn_3Pd_5$, $\delta Ga_3Ni_5$, $InPt_2$, and $Ni_5Al_3$. $Ni_5Al_3$, the most studied of the $Ga_3Pt_5$ materials, is a crystallographic derivative of the face-centered cubic ("FCC") structure. The underlayer may be formed in multiple layers wherein each layer is a different one of the foregoing FCC derivative materials, or wherein the layers alternate between a different one of the foregoing FCC derivative materials and a body-centered cubic ("BCC") derivative material. The Co or Co alloy magnetic layer has a HCP structure deposited with its magnetic easy axis substantially parallel to the plane of the magnetic layer.

An overlayer that, in turn, may be covered by an overcoat may cover the magnetic layer. An organic lubricant is preferably added over the overcoat.

The recording medium may also include a first intermediate layer interposed between the magnetic layer and the underlayer. The first intermediate layer may be used to promote epitaxial crystalline growth of the magnetic layer. The first intermediate layer, if used, can consist of Cr, a Cr alloy, or a material having a BCC derivative crystalline structure, such as a material having a B2, $DO_3$, or $L2_1$ crystalline structure. Cr has a BCC crystalline structure. A derivative structure of a basic structure is one in which one or more symmetry elements of the basic, or "parent", structure (translational or orientational) is (are) suppressed. The basic periodicity and position of the atoms remains the same but the specific atomic occupancies change. BCC structures have many derivative structures, including but not limited to B2, $DO_3$, or $L2_1$. The BCC structure has two atoms in its unit cell. The occupancy of the atom at (000) and that at (½, ½, ½) is the same. The same can be seen to be true for the other examples of derivative structures. The degree of atomic order increases:for each crystal structure in the sequence of crystal structures from BCC to B2 to $DO_3$ to $L2_1$. Examples of suitable materials for the first intermediate layer include NiAl, AlCo, FeAl, FeTi, CoFe, CoTi, CoHf, CoZr, NiTi, CuBe, CuZn, AlMn, AlRe, AgMg, $Mn_3Si$ and $Al_2FeMn_2$. When NiAl is used as the material of the first intermediate layer, a strong NiAl (112) crystalline texture may be induced, thereby promoting an improved Co (1010) texture in the magnetic layer.

The recording medium may also include a second intermediate layer disposed between the first intermediate layer and the underlayer. The second intermediate layer may also be used to promote epitaxial crystalline growth of the magnetic layer. The second intermediate layer, infused, preferably consists of a material having a BCC derivative structure. When the material of the second intermediate layer consists of NiAl and the material of the first intermediate layer consists of Cr or a Cr alloy, a particularly strong Co (1010) texture may be induced on the magnetic layer by inducing a stronger NiAl (112) texture.

Yet a third intermediate layer may be placed in contact with the magnetic layer and the first intermediate layer. This layer may preferably consist of a non-magnetic HCP crystal structure such as a Co—Cr alloy, and is especially advantageous for providing a transition in lattice constant values from the BCC to the magnetic layer when the magnetic layer contains the larger atomic sized Pt element.

The novel underlayers of the present invention are FCC derivative structures. Their "natural" texture is the one with their close packed planes parallel to the plane of the film surface. These planes are the (221) planes of the $Ga_3Pt_5$ structure. These planes yield a very good match with the NiAl (112) on Cr (112) planes. Therefore, these new underlayers yield stronger (112) textures of the intermediate layers and, as a result, of the magnetic layers.

The novel underlayer of the recording medium of the present invention may be produced by a variety of methods. First, a bias voltage of about −300V may be applied to the substrate while a material with a B2 phase is deposited on the substrate. The bias voltage may be used to form the phases with the novel $Ga_3Pt_5$ structured underlayer of the present invention because of preferential sputtering of, for example, Ni from the NiAl target. The Co or Co alloy magnetic layer may then be grown on the underlayer. Second, and more preferably, the novel underlayer having a $Ga_3Pt_5$ structure may be deposited directly on the substrate from at least one target material or more, such as a target material having the 3:5 composition. The Co or Co alloy magnetic layer may then be grown on the underlayer, with or without the use of intermediate layer(s).

The invention also includes the target material for use in a sputter deposition process wherein the target material is sputtered onto a substrate to form the underlayer for the magnetic recording media of the present invention. The target material is made of a material that will form the $Ga_3Pt_5$ structure when deposited, and is preferably NiAl, wherein the atomic percentage of Ni is in the range of about 62 to 69% and the atomic percentage of Al is within the range of about 31 to 38%.

BRIEF DESCRIPTION OF THE DRAWINGS

The advantages of the present invention can be better understood by reference to the drawings in which:

FIGS. 2(a)–(e) are the phase diagrams of various materials having the $Ga_3Pt_5$ crystalline structure, wherein FIG. 2(a) is the Ni—Al phase diagram, FIG. 2(b) is the Ga—Pt phase diagram, FIG. 2(c) is the Mn—Pd phase diagram, FIG. 2(d) is the Ga—Ni phase diagram, and FIG. 2(e) is the In—Pt phase diagram;

FIGS. 5(a) and (b) respectively show the x-ray diffraction spectra of 100 nm NiAl films and 400 nm NiAl films deposited at various substrate bias voltages on smooth glass substrates to form an $Ni_5Al_3$ underlayer;

DETAILED DESCRIPTION OF THE INVENTION

The recording media of the present invention may be a rigid magnetic disc rotatable about an axis that is incorporated into a disc drive (not shown). Typically, the disc drive includes a magnetic transducing head, or slider, which is supported on a movable arm that is in turn part of a suspension assembly for moving the head over the surface of the disc. The transducing head, when moving over the surface of the media during normal operation, is maintained in a spaced parallel relationship relative to the surface of the media, in close proximity to the media. A typical distance is 10 μin or less. Disc drives such as this are standard equipment in the industry. See, Mee, C. D. and Daniel, E. D., MAGNETIC RECORDING, Vols. I–III (McGraw-Hill pub. 1987); F. Jorgenson, The Complete Handbook of Magnetic Recording, Chapter 16 (3rd. ed. 1988), and U.S. Pat. No. 5,062,021, the relevant disclosures of which are incorporated herein by reference. The magnetic recording media of the present invention may also be used with storage devices such as flexible magnetic discs or tapes using known flexible substrates or x-y addressable storage systems that might use ridge substrates.

Figure 1:
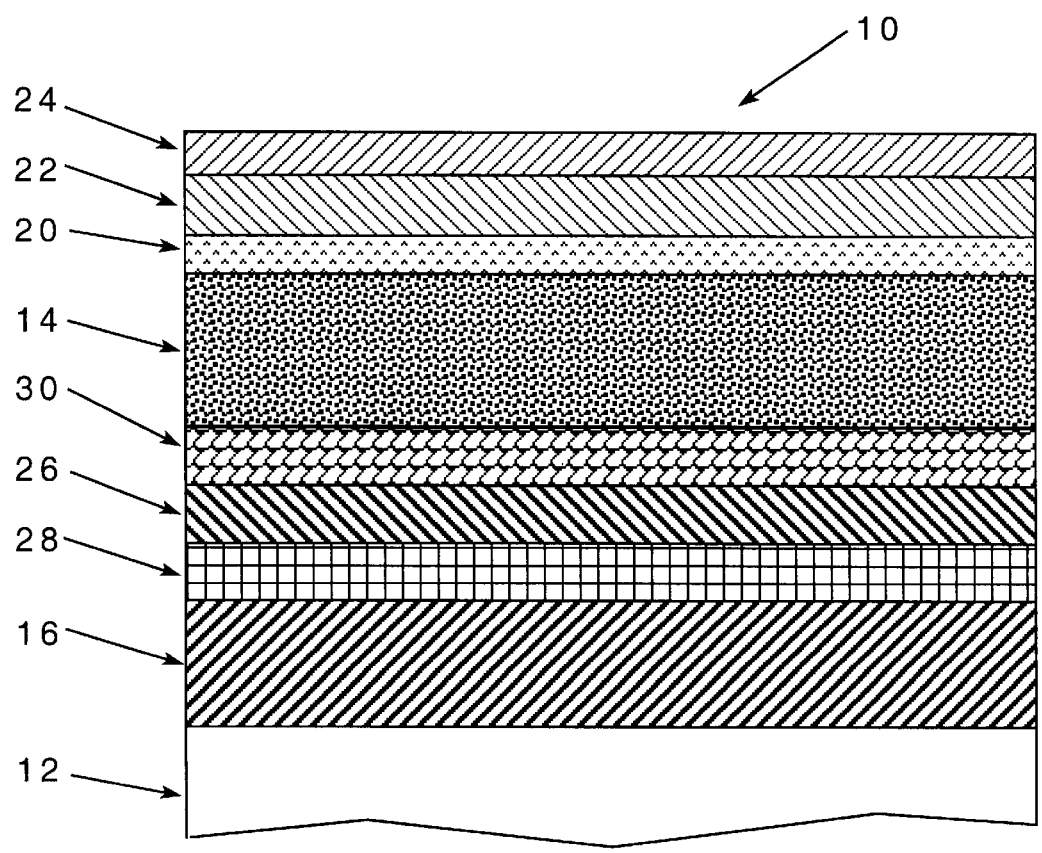
FIG. 1 is a schematic illustration of an embodiment of a multilayer structure of the recording media of the present invention.

Referring to FIG. 1, it is seen that the preferred embodiment of the magnetic recording medium 10 of the present invention is comprised of a flexible or rigid substrate 12 in disc or tape form, an underlayer 16, and a magnetic layer 14. In addition, there may be an overlayer 20, an overcoat 22, and an organic lubricant 24 positioned above the magnetic layer as shown. Further, a first intermediate layer 26 may optionally be disposed between the magnetic layer 14 and the underlayer 16. If a first intermediate layer 26 is included, then a second intermediate layer 28 may be disposed between the first intermediate layer 26 and the underlayer 16. Finally, a third intermediate layer 30 may be positioned between the first intermediate layer 26 and the magnetic layer 14.

In the preferred embodiment, the substrate 12 is a disc formed of glass, glass ceramic, silicon or an aluminum alloy coated with NiP. Alternative materials such as canasite, or SiC may also be used. The substrate 12 may also be in the form of a tape.

The magnetic layer 14, is deposited with the longitudinal magnetic easy axis thereof substantially parallel to the plane of such magnetic layer 14 and preferably comprises Co or a Co alloy such as CoCr, SmCo, CoP, CoPt, CoNiCr, CoNiPt, CoCrTaSi, CoCrPtB, CoCrPtTa, CoCrPt, or other known Co alloy magnetic films.

Figure 2A:
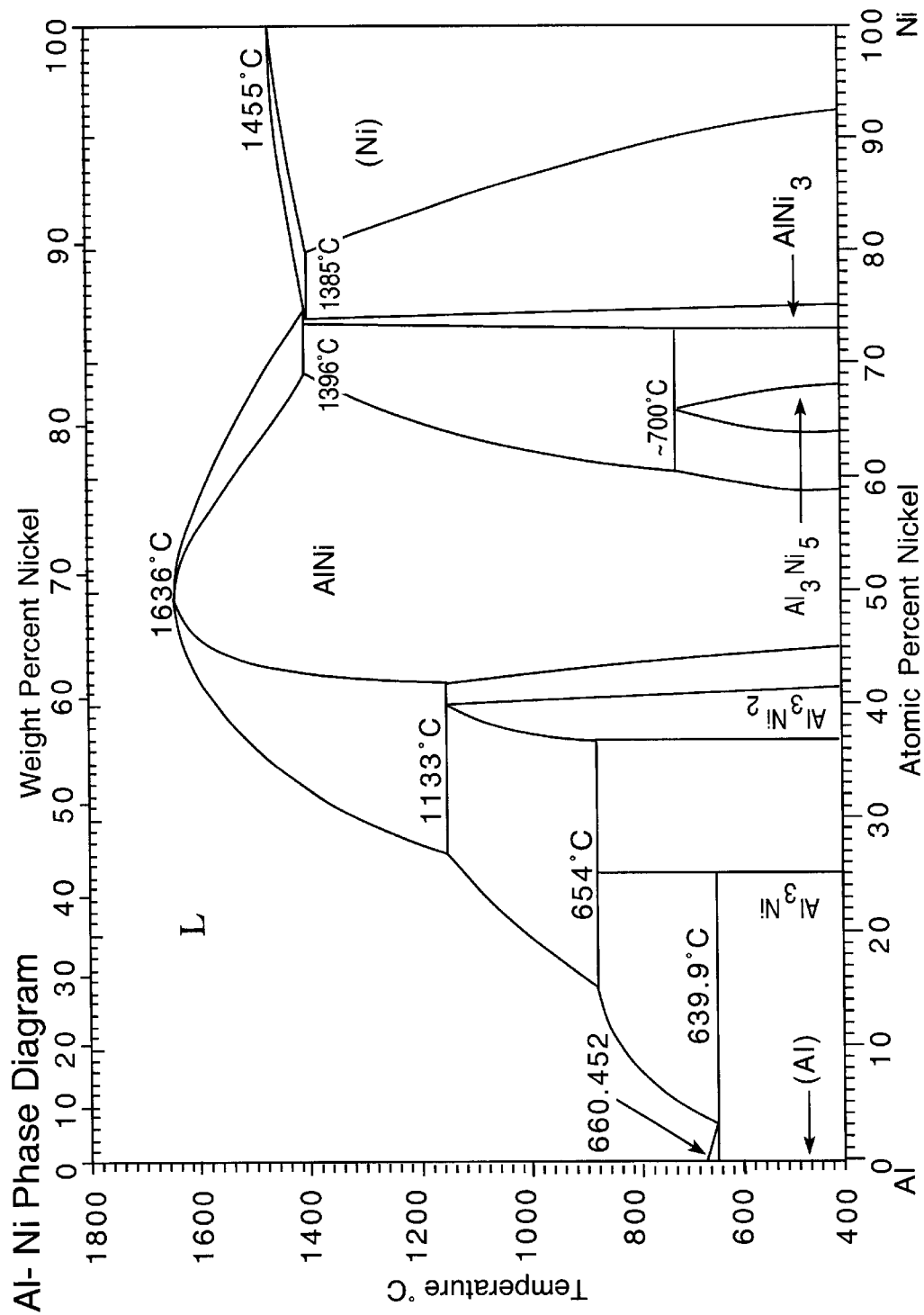
Figure 2B:
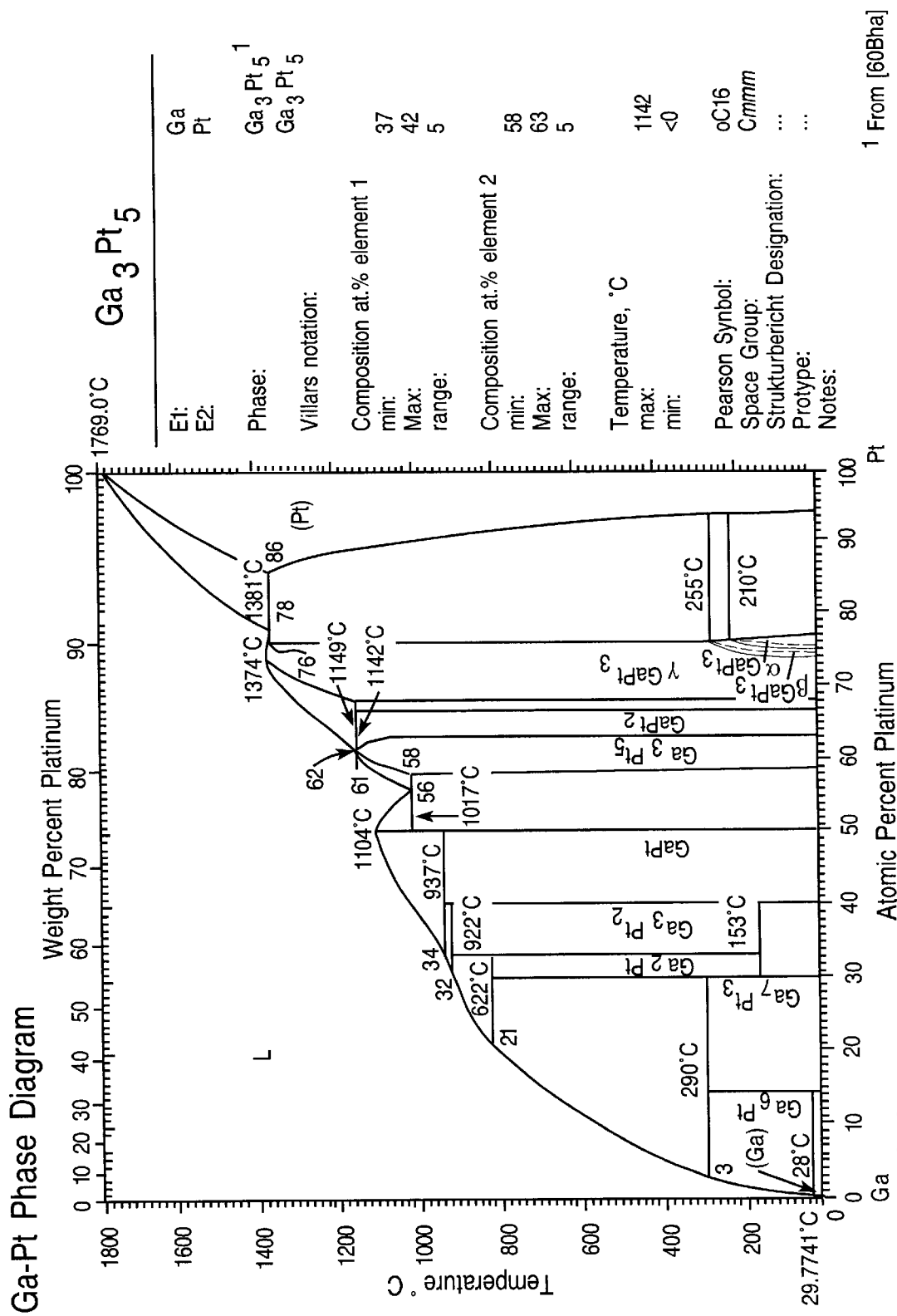
Figure 2C:
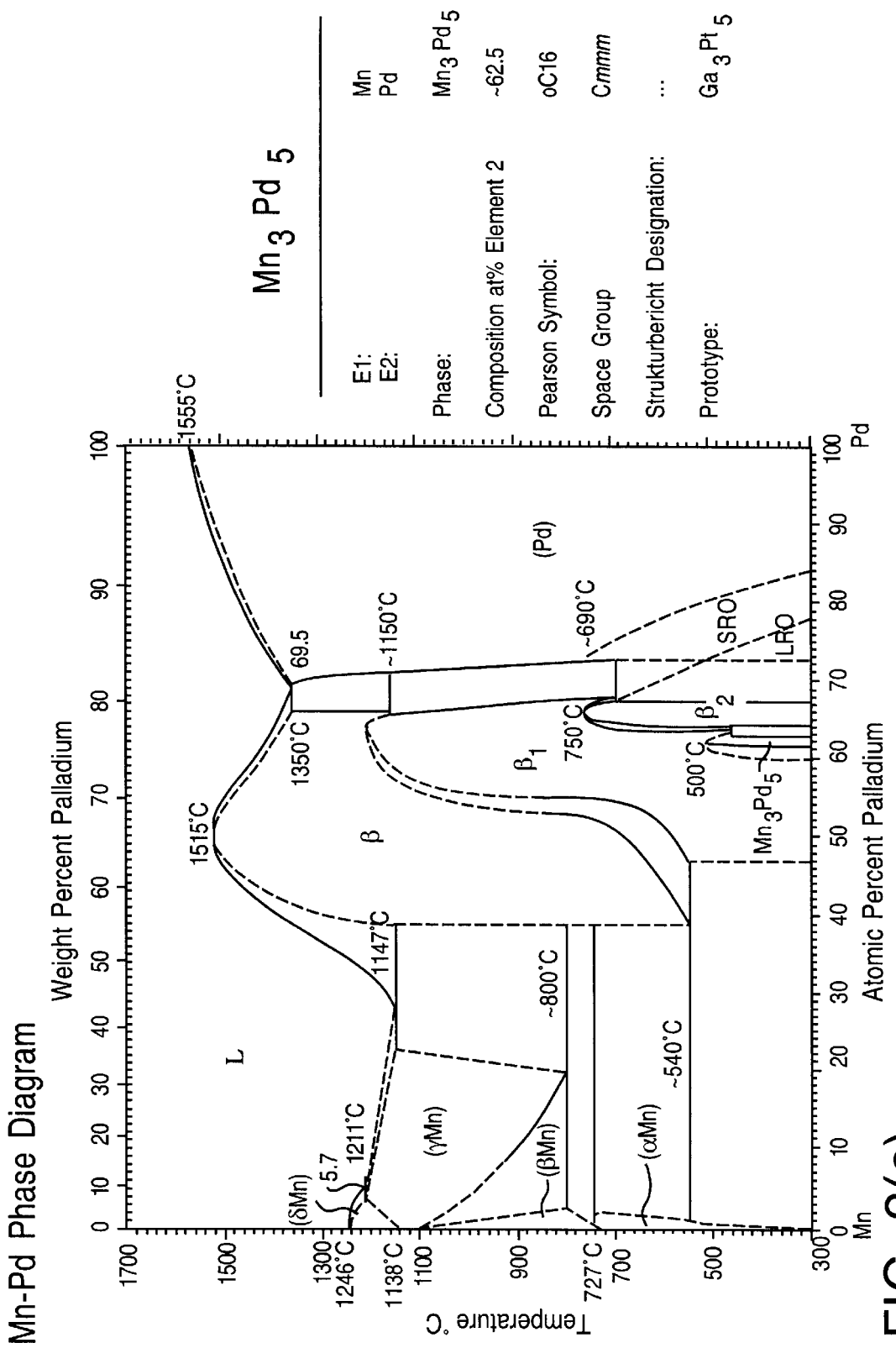
Figure 2D:
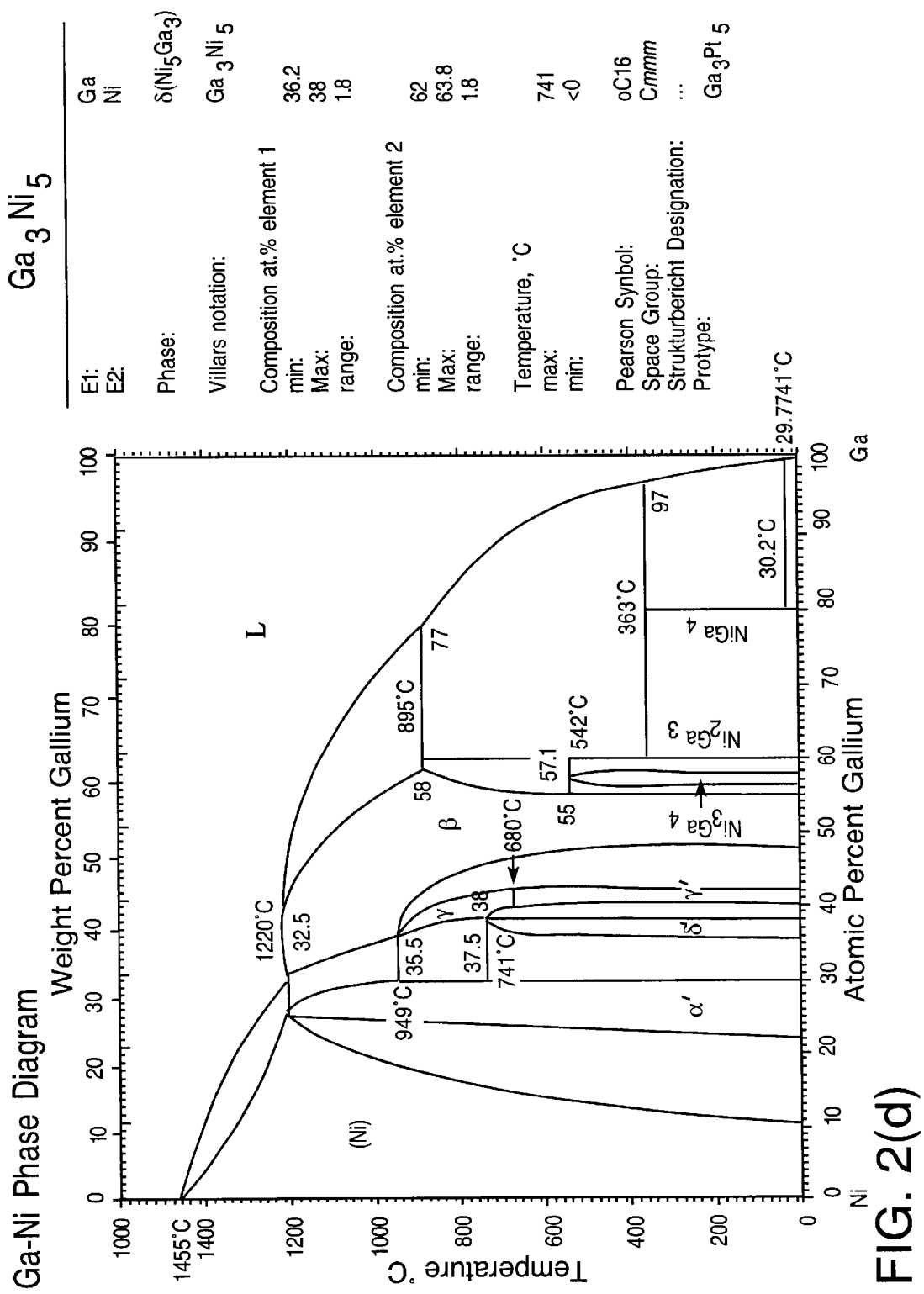
Figure 2E:
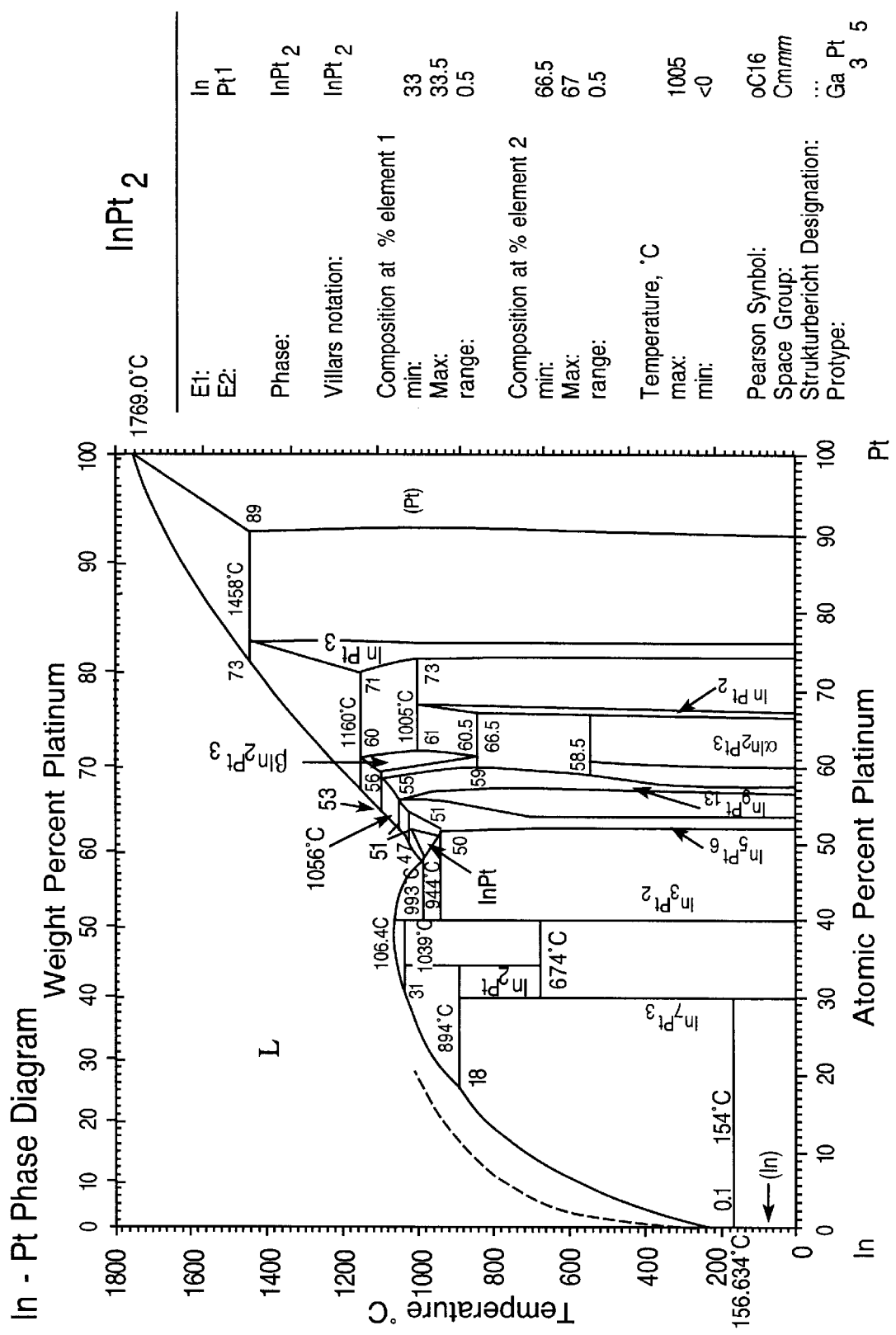
Figure 3:
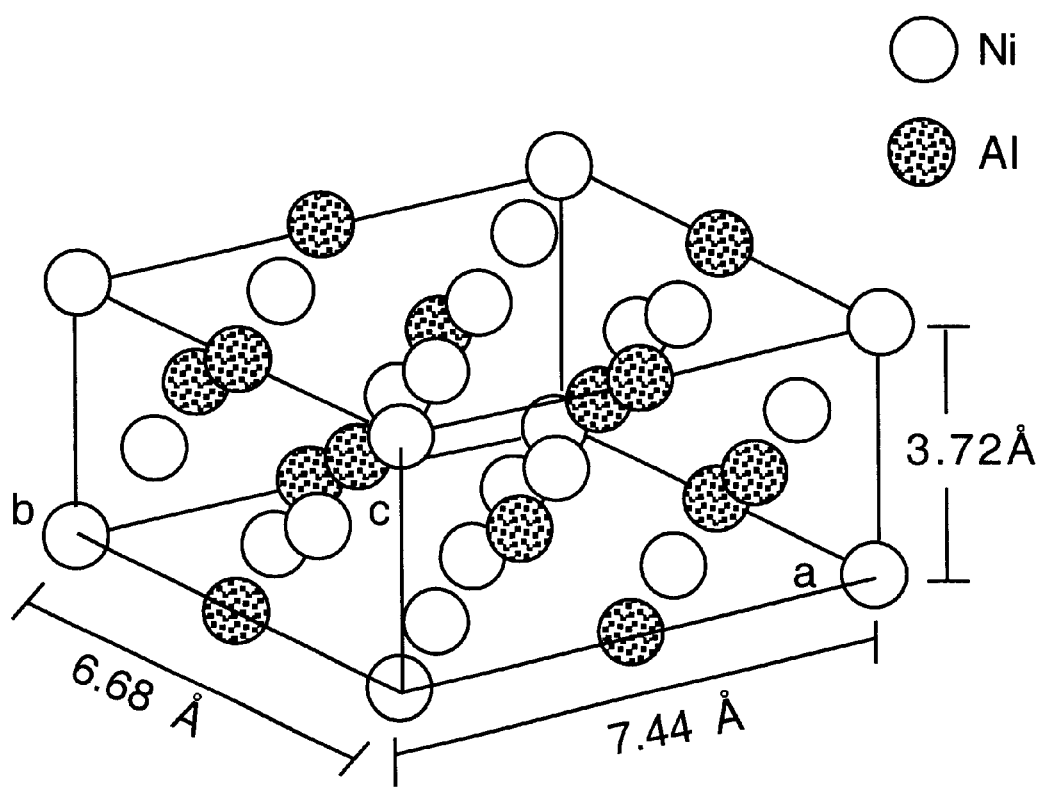
FIG. 3 is a schematic illustration of the $Ni_5Al_3$ unit cell.
Figure 4A:
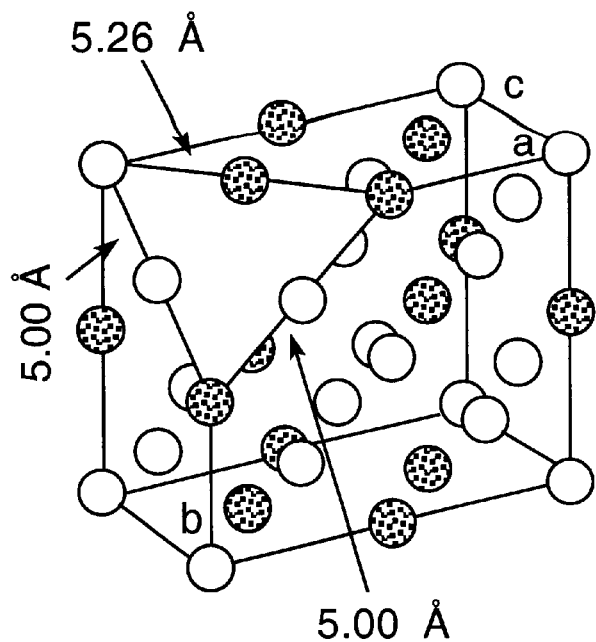
FIGS. 4(a) and (b) show schematic illustrations of the $Ni_5Al_3$ (221) plane along with the epitaxial relationship between the $Ni_5Al_3$ (221) plane and the Co (1010) plane, respectively.
Figure 4B:
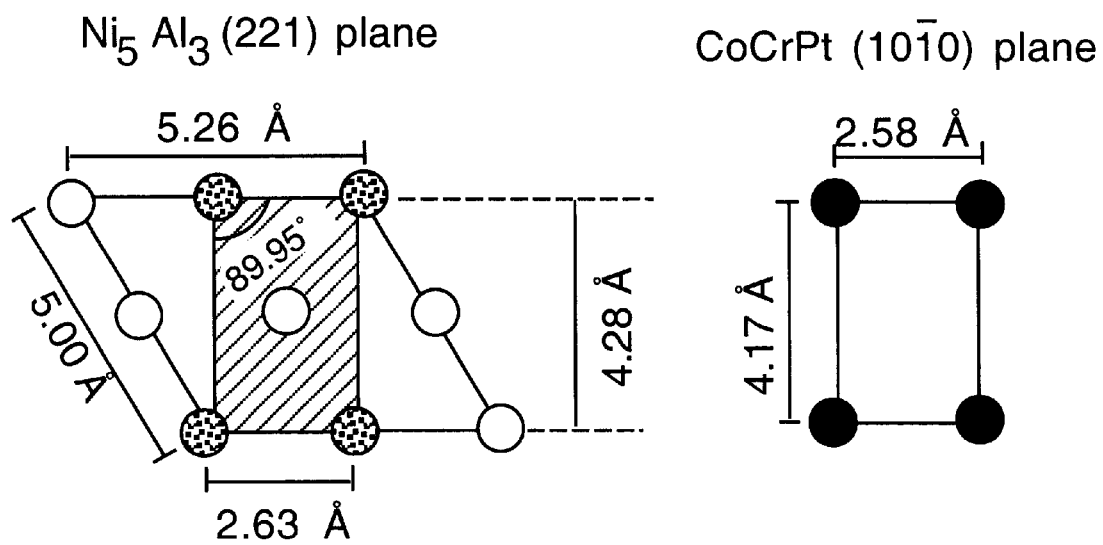

The underlayer 16 consists of a material having the $Ga_3Pt_5$ crystalline structure, which has orthorhombic symmetry. The underlayer is most preferably $Ni_5Al_3$. The NiAl phase diagram is shown in FIG. 2(a). As can be seen, the single phase region of $Ni_5Al_3$ extends from about 64 at % to 68 at % of Ni and 38 at % to 32 at % of Al below 700° C. Because the $Ni_5Al_3$ phase is stable at a low temperature, it is expected that the $Ni_5Al_3$ phase should be easy to obtain by various known vacuum deposition methods. Referring now to FIG. 3, the $Ga_3Pt_5$ crystalline structure of the $Ni_5Al_3$ underlayer 16 is shown. As is apparent, $Ni_5Al_3$ is a crystallographic derivative of the FCC crystalline structure. The lattice parameters of the $Ni_5Al_3$ phase are a=7.44 Å, b=6.68 Å, and c=3.72 Å, respectively. Note that lattice parameters a and b are about twice as large as c. By referring to FIG. 4(a), it can also be seen that the $Ni_5Al_3$ close-packed planes are its (221) planes, hence the $Ni_5Al_3$ (221) planes are the lowest energy planes for $Ni_5Al_3$. This means that the $Ni_5Al_3$ (221) texture can be obtained right from the beginning of the $Ni_5Al_3$ deposition. FIG. 4(b) illustrates that the $Ni_5Al_3$ (221) planes have a very small misfit with the Co alloy (1010) planes. Consequently, the $Ni_5Al_3$ (221) texture is expected to be very strong, thereby inducing a strong Co (1010) texture with small Co grains on the magnetic layer.

Other $Ga_3Pt_5$ structured materials that may be used for the underlayer 16 include $Ga_3Pt_5$, $Mn_3Pd_5$, $\delta Ga_3Ni_5$, and $InPt_2$. Like $Ni_5Al_3$, these materials are crystallographic derivative FCC crystalline structure. As can be seen by referring to Table I below, the a and b lattice parameters for these materials, like $Ni_5Al_3$, are approximately twice as large as the c lattice parameter, therefore it is expected that they should provide the same advantages as the $Ni_5Al_3$ underlayer. $Mn_3Pd_5$ and $\delta Ga_3Ni_5$, like $Ni_5Al_3$, have a B2 structure at elevated temperatures.

TABLE I

Lattice Parameters Of Materials With The $Ga_3Pt_5$ Crystalline Structure

| Material | a(Å) | b(Å) | c(Å) |
| --- | --- | --- | --- |
| $Ga_3Pt_5$ | 8.031 | 7.440 | 3.948 |
| $Mn_3Pd_5$ | 8.072 | 7.279 | 4.044 |
| $\delta Ga_3Ni_5$ | 7.510 | 6.708 | 3.753 |
| $InPt_2$ | 8.180 | 7.810 | 4.080 |
| $Ni_5Al_3$ | 7.440 | 6.680 | 3.720 |

It is anticipated that an underlayer 16 comprised of two or more layers wherein each layer is a different one of the foregoing FCC derivative materials may be used. For example, it is believed that a multiple layered underlayer 16 having a first layer of $Ni_5Al_3$ and a second layer of $Ga_3Pt_5$, $Mn_3Pd_5$, $\delta Ga_3Ni_5$, or $InPt_2$ may be used. Also, the underlayer 16 may comprise two or more layers wherein the layers alternate between one of the foregoing FCC derivative materials and a BCC derivative material.

Referring again to FIG. 1, an overlayer 20 for preventing corrosion may be provided adjacent to and preferably in contact with the magnetic layer 14. The overlayer 20 is 1–10 nm (10–100 Å) thick and maybe made of W, Ta, Zr, Ti, Y, Pt, Cr or any combination thereof. An overcoat 22 may also be provided external to the overlayer 20, so that the overlayer 20 is positioned between the magnetic layer 14 and the overcoat 22. The overcoat 22 provides a mechanical wear layer and is typically 2.5–30 nm (25–300 Å) thick. It is preferably made of a ceramic material or diamond like carbon such as $SiO_2$, SiC, CN, $ZrO_2$, or C. An organic lubricant 24 maybe disposed on the overcoat 22. The lubricant is about 1–30 nm (10–300 Å) thick and is preferably a fluoro-chlorocarbon or a perfluoroether. Examples include $CCl_2FCClF_2$, $CF_3(CF_2)_4CF_3$, $CF_3(CF_2)_5CF_3$, $CF_3(CF_2)_{10}CF_3$, and $CF_3(CF_2)_{16}CF_3$.

FIG. 1 also illustrates that the magnetic recording medium 10 of the present invention may also include a first intermediate layer 26 disposed between the magnetic layer 14 and the underlayer 16. The first intermediate layer 26 is preferably made of Cr, a Cr alloy, or a material having a BCC derivative structure, which is the structure of Cr. Materials with the B2, $DO_3$ and $L2_1$ structures are examples of ordered structural derivatives of the BCC structure. Good candidates for the first intermediate layer 26 include NiAl, AlCo, FeAl, FeTi, CoFe, CoTi, CoHf, CoZr, NiTi, CuBe, CuZn, AlMn, AlRe, AgMg, $Mn_3Si$, and $Al_2FeMn_2$.

Still referring to FIG. 1, it is seen that a second intermediate layer 28 may also be included in the magnetic recording medium 10 of the present invention. When used, the second intermediate layer is disposed between the first intermediate layer 26 and the underlayer 16. The second intermediate layer 28 is preferably made of a material having a BCC derivative structure, such as, for example, B2, $DO_3$, or $L2_1$.

A third intermediate layer 30 may be positioned between the first intermediate layer 26 and the magnetic layer 14. When included, the third intermediate layer 30 may consist of a non-magnetic HCP crystalline structured material, such as a Co—Cr alloy. The third intermediate layer 30 may be advantageous for providing a transition in lattice constant values from the BCC of the first intermediate layer 26 to the magnetic layer 14 when the magnetic layer 14 contains the larger atomic sized Pt element, such as when, CoPt, CoNiPt, CoCrPtB, CoCrPtTa, or CoCrPt is used.

The target used in the sputtering process to form the recording media is made of a material that will form the $Ga_3Pt_5$ structure when deposited. The $Ni_5Al_3$ underlayer, for example, is formed using a target material having an atomic percentage of Ni within the range of about 63 to 69% and an atomic percentage of Al within the range of about 31 to 37%. Referring to FIG. 2(a), the phase diagram shows the atomic percentage of Ni in $Ni_5Al_3$ to be within the range of 64–68%. Those skilled in the art will recognize, however, that some variation from the precision shown in the phase diagrams is exhibited from time to time in actual practice.

To compare the in-plane magnetic properties of various embodiments of the magnetic recording medium 10 of the present invention, CoCrPt films were sputter-deposited on glass substrates by RF diode sputtering in an LH Z-400 system. The base pressure was $5 \times 10^{-7}$ mtorr. The target diameter was about 75 mm. The CoCrPt films were deposited at room temperature with a fixed argon pressure of 10 mtorr, RF power of 2.3 W/cm$^2$ and −100 V substrate bias voltage. The CoCrPt films were 40 nm thick. Characterization of the CoCrPt/NiAl thin films was carried out using a Rigaku X-ray diffractometer with Cu Kα radiation to determine texture. A Phillips Em 420T transmission electron microscope ("TEM") was used to observe microstructure. A vibrating sample magnetometry ("VSM") with field up to 10 kOe and an Alternating Gradient Force Magnetometer ("AGM") with fields up to 13 kOe were used to measure the magnetic properties.

A $Ni_5Al_3$ underlayer 16 can be deposited from a NiAl target by applying a substrate bias voltage during deposition of the $Ni_5Al_3$ underlayer. To achieve the $Ni_5Al_3$ underlayer by this method, NiAl was deposited at various substrate bias voltages at 10 mtorr, 2.3 W/cm$^2$ and room temperature. Because the B2 (112) texture was more easily observed by x-ray diffraction in thicker B2 films, NiAl was also deposited to a thickness of 400 nm while varying bias voltages.

Referring to FIGS. 5(a) and 5(b), the x-ray diffraction spectra of 100 nm and 400 nm thick NiAl films sputter-deposited at various bias voltages are shown, respectively. As is apparent, these films show very strong NiAl (110) peaks when sputter-deposited at a substrate bias of −100V. Negative substrate bias voltage attracts some positive argon ions to bombard the substrate surface. The atoms that are loosely bound to neighbors can be easily removed from the depositing thin film by bombarding with the argon ions, which occurs when a negative bias voltage is applied. Consequently, the NiAl thin film becomes more close-packed with fewer defects when a substrate bias voltage is applied. Therefore, it is consistent that the most pronounced x-ray diffraction peak of the NiAl films with −100V bias is the NiAl (110) peak, because the NiAl (110) plane is the closest-packed plane for the B2 structure. As is also apparent, the intensity of the NiAl (110) peak is strongest at a −100V substrate bias and becomes weaker with increasing substrate bias voltages. The position of this peak also shifts 1° to the left in the x-ray diffraction spectra of the 100 nm and 400 nm thick NiAl films as the magnetic of negative substrate bias voltage is increased. This peak position shift implies a lattice parameter change due either to the occurrence of a new phase or stress resulting from the substrate bias voltage.

Figure 6A:
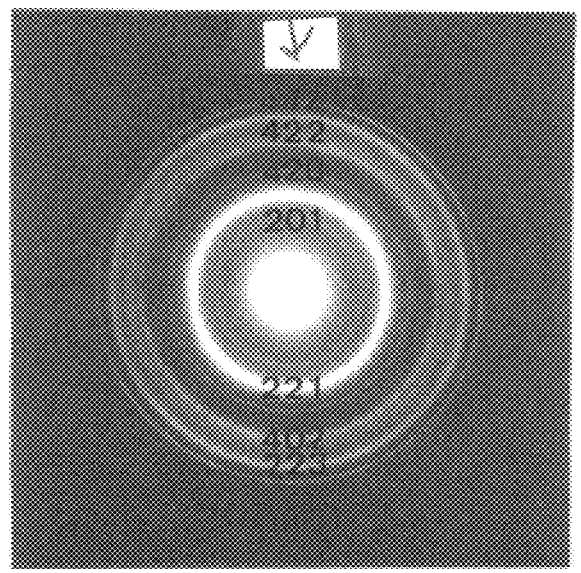
FIGS. 6(a) and (b) respectively show the bright field TEM micrograph and corresponding electron diffraction of a 100 nm NiAl film sputtered at a substrate bias voltage of −300V to form an $Ni_5Al_3$ underlayer.

Now referring to FIG. 6(a), it is seen that the TEM selected-area diffraction pattern of the 100 nm NiAl thin film deposited at a substrate bias of −300V shows a ring pattern of the $Ni_5Al_3$ phase. As is seen by again referring to FIG. 5, the 2θ of the $Ni_5Al_3$ x-ray diffraction peak is at 43°, which is 1° off from the NiAl (110) peak. As a result, the peak shift in the x-ray diffraction spectra can be explained by the formation of the $Ni_5Al_3$ phase at the −300V bias. The appearance of the $Ni_5Al_3$ phase may result from the Al atoms being more easily taken off by the bombardment of argon ions on the substrate than Ni atoms as substrate bias voltage is applied. Thus, applying a substrate bias voltage of about −300V while sputter depositing NiAl onto a substrate can form the $Ni_5Al_3$ underlayer.

Figure 7A:
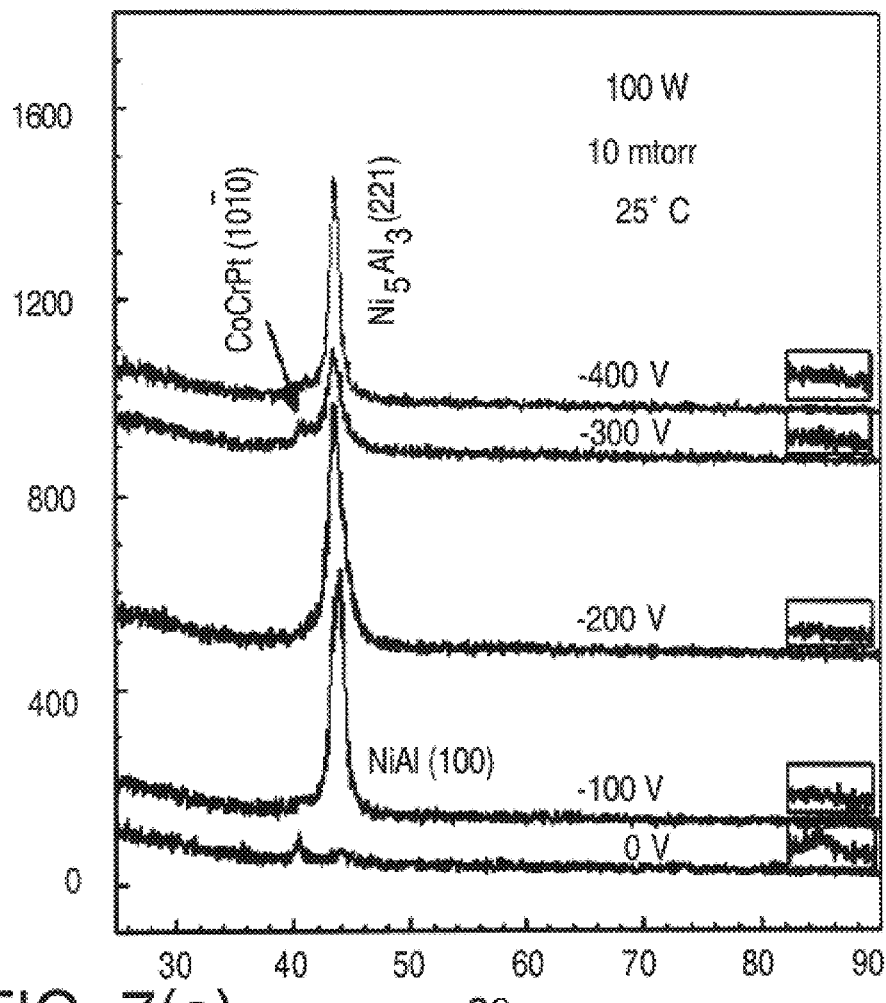
FIGS. 7(a) and (b) show the x-ray diffraction spectra of 40 nm CoCrPt/100 nm NiAl films on glass substrates deposited at various substrate bias voltages to form an $Ni_5Al_3$ underlayer, and the TEM micrograph of the 40 nm CoCrPt/ 100 nm NiAl films deposited at a substrate bias voltage of −300 V to form an $Ni_5Al_3$ underlayer, respectively.

Referring next to FIG. 7, the x-ray diffraction spectra of the 40 nm CoCrPt/100 nm NiAl thin film at various substrate bias voltages during deposition of the NiAl films are shown. As can be seen, the CoCrPt (1010) peaks appear by deposition onto the underlayers prepared with a substrate bias voltage of 0V and −300V. When no substrate bias is applied, the NiAl (112) texture is obtained which, in turn, induces the CoCrPt (1010) texture. At the substrate bias voltage of −300V, it is the $Ni_5Al_3$ (221) texture that induces the CoCrPt (1010) texture due to the small mismatch of the $Ni_5Al_3$ (221) plane and the CoCrPt (1010) plane as illustrated in FIG. 4(b).

Figure 6B:
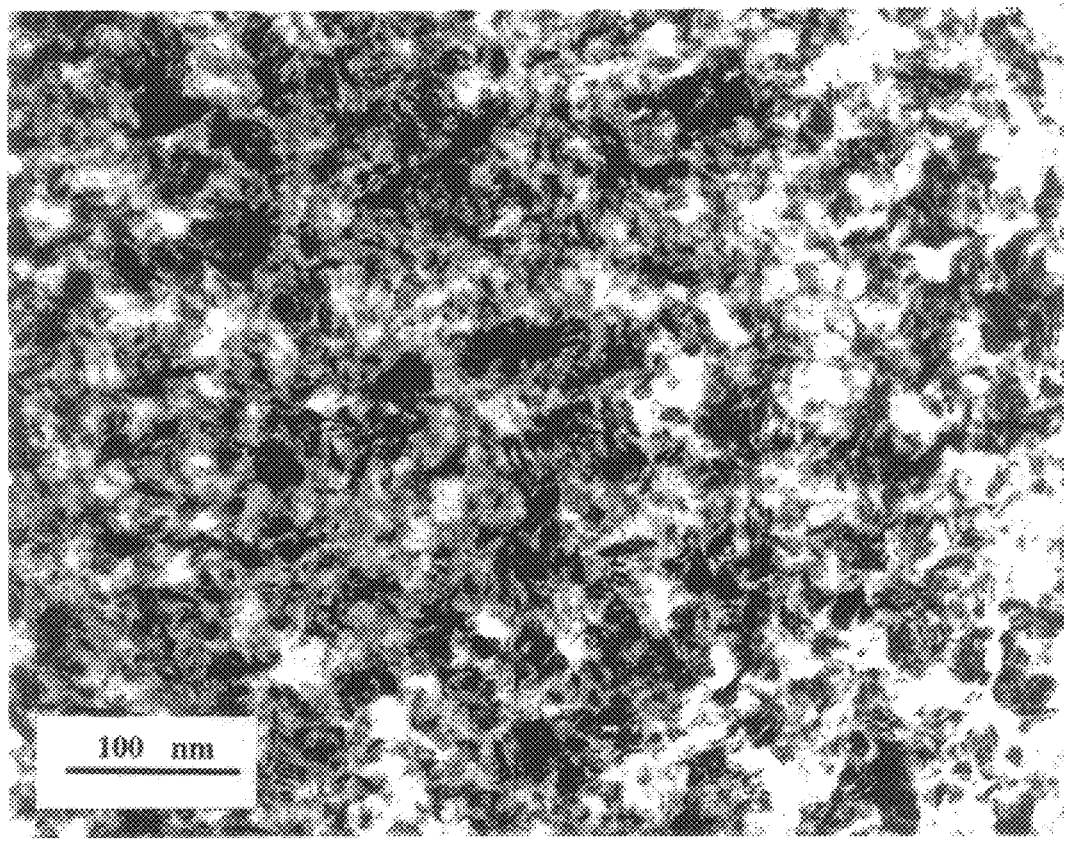
Figure 7B:
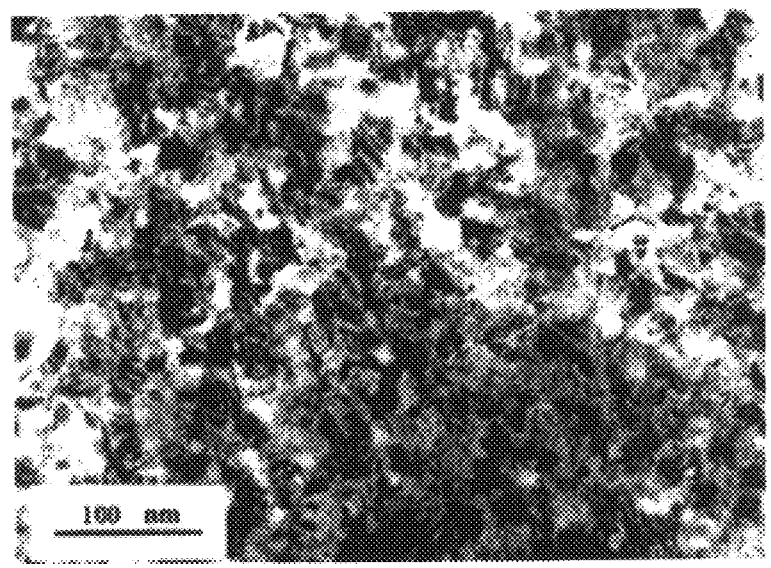

The grain size of the NiAl 100 nm thick film with the $Ga_3Pt_5$ crystal structure which was sputtered at a substrate bias of −300V from a NiAl target and the 40 nm CoCrPt/100 nm $Ni_5Al_3$ (deposition at a substrate bias of −300V) films are shown on the TEM bright field images in FIGS. 6(b) and 7(b), respectively. The grain size is about 30 nm in both instances. The large grain size in the 100 nm $Ni_5Al_3$ thin film sputtered at the −300V bias may be due to the high substrate bias voltage and may be eliminated by sputtering $Ni_5Al_3$ films directly from the $Ni_5Al_3$ targets, as is described below.

Figure 8:
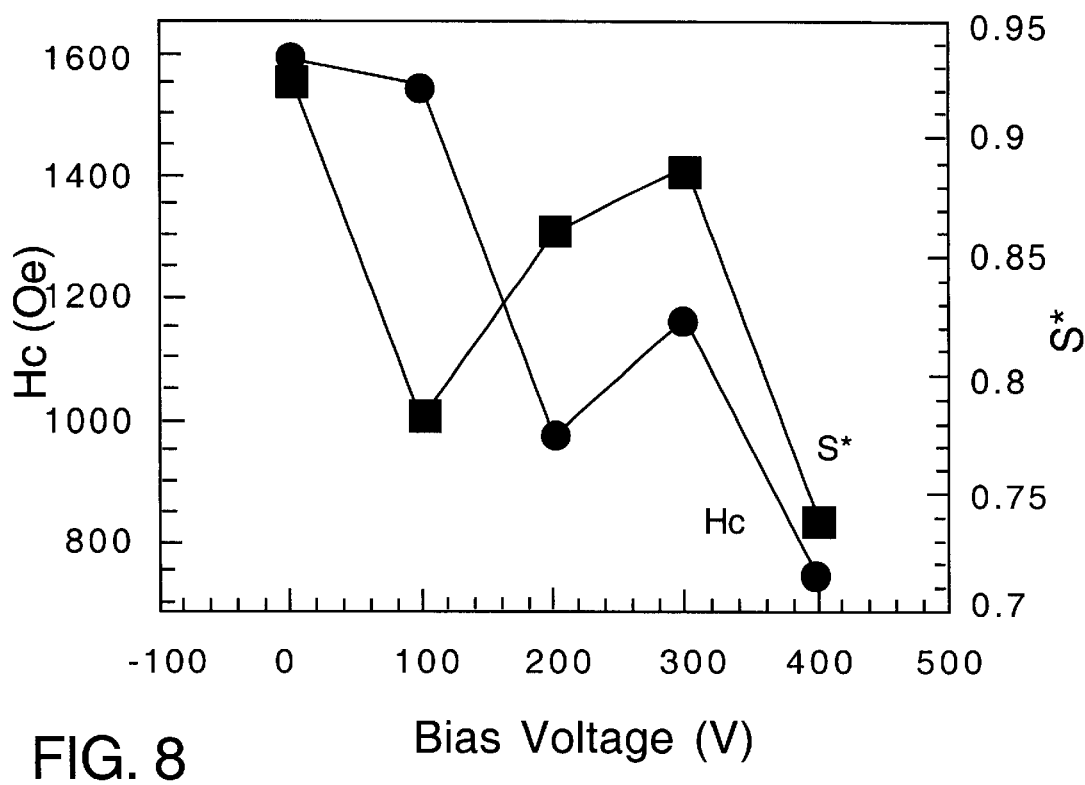
FIG. 8 plots the in-plane coercivity and squareness of the 40 nm CoCrPt films on the 100 nm $Ni_5Al_3$ underlayers deposited at various substrate bias voltages to form an $Ni_5Al_3$ underlayer.

Referring now to FIG. 8, the magnetic properties of the 40 nm CoCrPt/100 nm $Ni_5Al_3$ thin films with various substrate bias voltages are shown. As can be seen, the coercivity (Hc) and the coercive squareness (S*), which are crucial to the recording performance of a Co alloy thin film for a fixed composition, are highest at zero bias voltage and decrease at a relatively low bias voltage (i.e., −100V) due to the presence of a strong NiAl (110) texture. However, both Hc and S* increase again at a bias voltage of −300V because of the reappearance of the CoCrPt (1010) texture induced as a result of the appearance of the $Ni_5Al_3$ (221) texture.

The novel underlayer 16 of the present invention can more preferably be obtained by direct deposit from at least one target material. When direct depositing from a single target material, the target material composition should be near the desired layer composition, i.e., the target material should be an alloy having an atomic composition ratio within the ranges substantially as shown in FIGS. 2(a) through 2(e) to achieve, upon sputtering, a $Ga_3Pt_5$ structured underlayer 16. Of course, those skilled in the art will appreciate that some variation of composition occurs during the deposition process and that a single target material with a composition within the range of the 3:5 phase field of the $Ga_3Pt_5$ structure is adequate. For example, referring to FIG. 2(a), a target material containing approximately 64 at %Ni to 68 at %Ni at approximately temperatures below 400° C. could be used as a single target material to achieve the $Ni_5Al_3$ underlayer 16. Similarly, at lower temperatures, a $Ga_3Pts$ underlayer 16 can be achieved from a single target containing about 58 at %Pt to 63 at %Pt (FIG. 2(b)), a $Mn_3Pd_5$ underlayer 16 can be achieved from a single target containing about 61.5 at %Pd to 63 at %Pd (FIG. 2(c)), a δGa₃Ni₅ underlayer 16 can be achieved from a single target containing about 36 at %Ga to 38 at %Ga (FIG. 2(d)), and a InPt₂ underlayer 16 can be achieved from a single target containing about 66.5 at %Pt to 67 at %Pt (FIG. 2(e)).

Direct sputter deposition from multiple targets may also be employed. In this case, each target material may comprise a pure element. For example, direct sputter deposition of an Ni₅Al₃ underlayer 16 can be achieved from two target materials, one being pure Ni and the other being pure Al. Also, each target may comprise an alloy of the desired elements at various atomic compositions. For example, referring to FIG. 2(a), multiple NiAl targets in the composition range of about 45 at %Ni to about 73 at %Ni could be employed. Similarly, the novel underlayer 16 of the present invention could be acquired from multiple target materials of various compositions by referring to the phase diagrams set forth in FIGS. 2(b)–(e).

Figure 9:
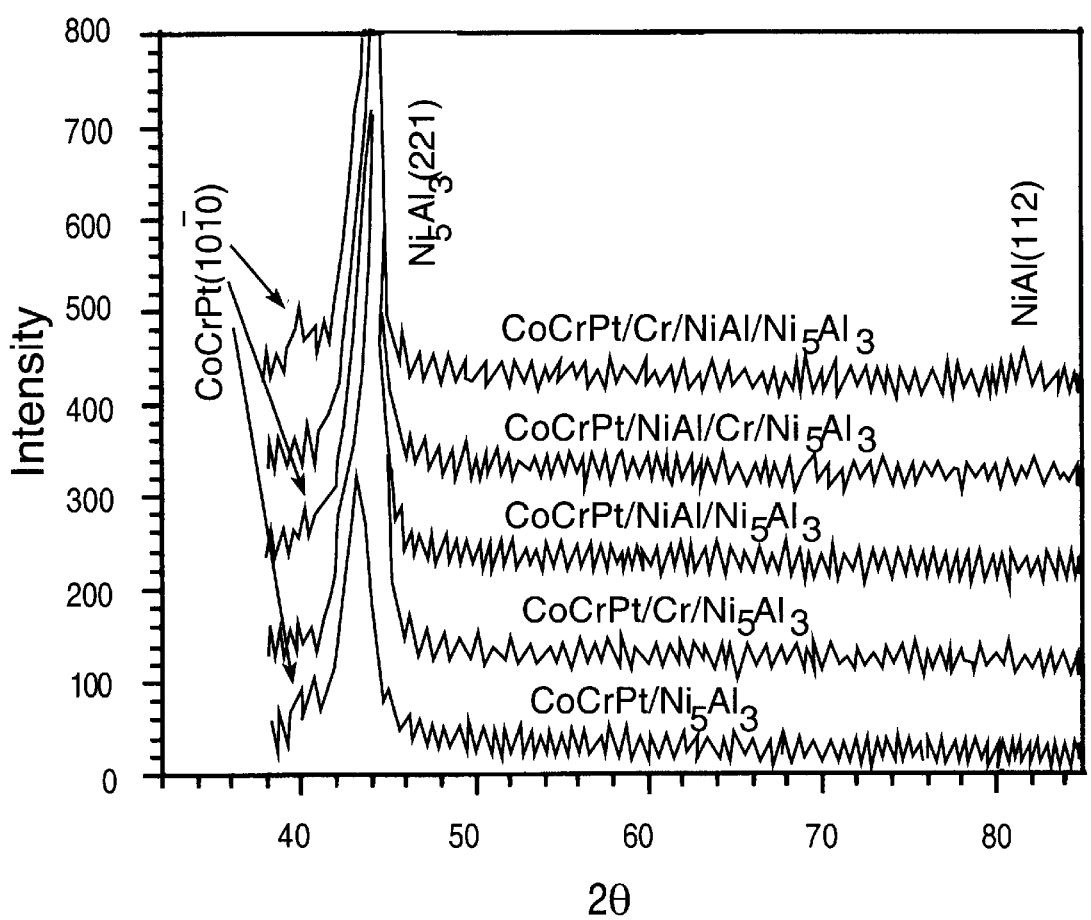
FIG. 9 shows the x-ray diffraction spectra of the CoCrPt films using different intermediate layers and a $Ni_5Al_3$ underlayer.
Figure 10:
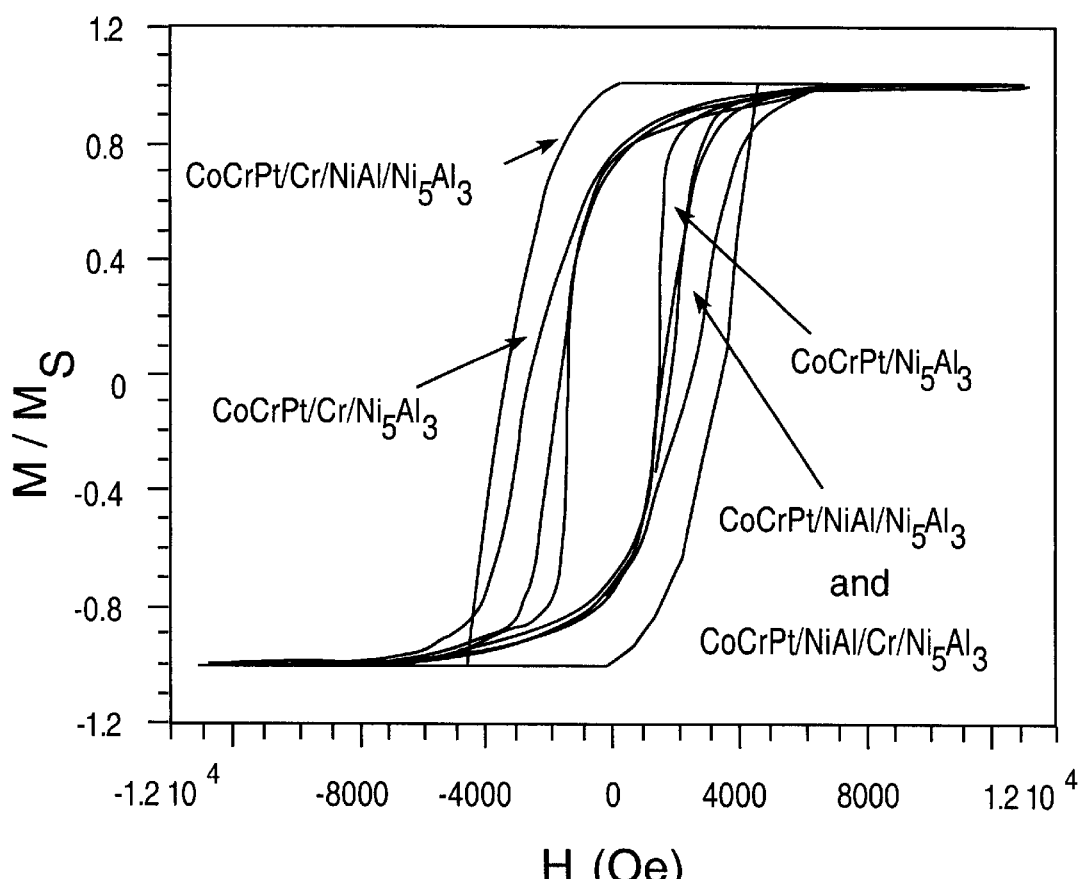
FIG. 10 shows the in-plane hysteresis loops of the 40 nm CoCrPt films using different intermediate layers and a $Ni_5Al_3$ underlayer.
Figure 11A:
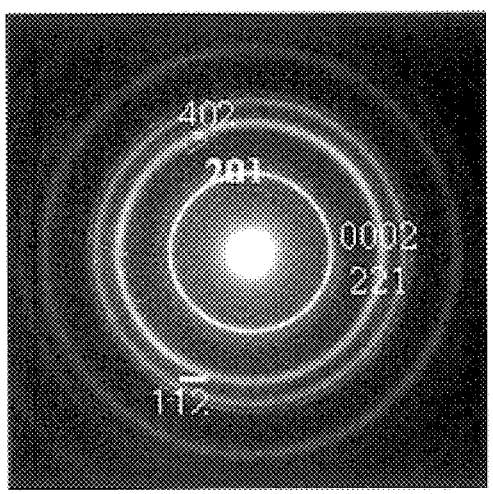
FIGS. 11(a) and (b) show the bright field TEM micrograph and corresponding electron diffraction pattern of a 40 nm CoCrPt magnetic layer/100 nm $Ni_5Al_3$ underlayer thin film disc, respectively.
Figure 11B:
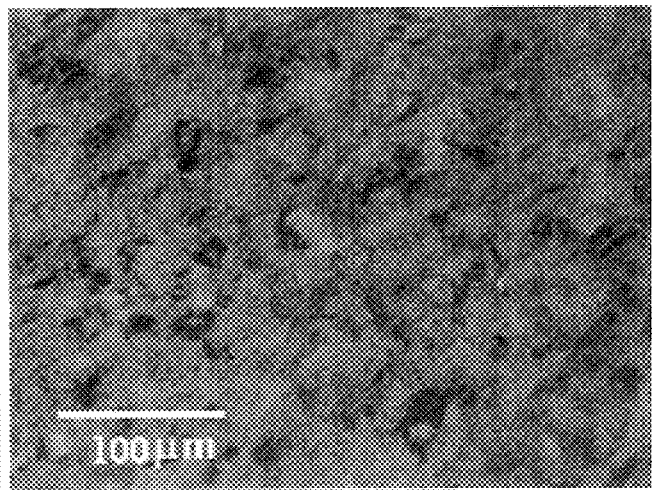

By way of illustration, a Ni₅Al₃ underlayer 16 was obtained by direct sputter deposit from a single Ni₅Al₃ target material. Referring to FIG. 9, the x-ray diffraction spectra of the resultant CoCrPt/Ni₅Al₃ thin film is shown. As can be seen, a strong (221) Ni₅Al₃ peak is observed since the Ni₅Al₃ is the lowest surface energy plane. The CoCrPt (1010) peak is also observed, thereby indicating that the Ni₅Al₃ texture induces the CoCrPt (1010) texture. The in-plane coercivity of the CoCrPt/Ni₅Al₃ thin film is shown in FIG. 10. As is apparent, the in-plane coercivity is about 1444 Oe. The grain size of the CoCrPt layer, as shown by the bright field TEM micrograph shown in FIG. 11, is 10–20 nm.

In the embodiment of the present invention wherein a 100 nm first intermediate layer 26 made of Cr is added between the CoCrPt magnetic layer 14 and the NisAl₃ underlayer 16, the CoCrPt texture is decreased a bit, as shown in FIG. 9. However, the coercivity increases from 1444 Oe to 2528 Oe as shown in FIG. 10. As is apparent, the peak δM value for the CoCrPt/Ni₅Al₃ thin film is 0.4 while for the CoCrPt/Cr/Ni₅Al₃ thin film it is 0.17. The exchange coupling is thus reduced after adding the Cr first intermediate layer 26. A reduced peak δM value is indicative of reduced grain to grain exchange coupling and, therefore, of a reduced media noise. The increase in the in-plane coercivity is due to the greater degree of texture, but may also be due in part to the reduction of the exchange coupling between the Co grains caused by the presence of Cr at the grain boundaries.

In another embodiment of the present invention, the magnetic recording medium 10 includes a first intermediate layer 26 made of a material having a BCC structure or a derivative thereof, such as NiAl. Adding a 100 nm NiAl film between the CoCrPt magnetic layer 14 and the Ni₅Al₃ underlayer 16 can induce a strong NiAl (112) texture and hence an improved CoCrPt (1010) texture. This is shown in FIG. 9. Referring to FIG. 10, it is seen that the CoCrPt/NiAl/Ni₅Al₃ thin film has an in-plane coercivity of about 1785 Oe. Also, the δM peak intensity is about 0.22, thus indicating a stronger exchange coupling than that of the CoCrPt/Cr/Ni₅Al₃ thin film described earlier.

In the most preferred embodiment of the magnetic recording medium 10 of the present invention, a second intermediate layer 28 made of NiAl is added between the first intermediate layer 26 described above and the Ni₅Al₃ underlayer 16. For example, where the first intermediate layer is made of Cr, the resultant CoCrPt/Cr/NiAl/NisAl₃ thin film yields strong CoCrPt (1010) and NiAl (112) peaks as is shown in FIG. 9. The in-plane coercivity is also very high, about 3382 Oe and the δM is about 0.12, as is shown in FIG. 10. These results indicate that the Ni₅Al₃ (221) texture can induce the NiAl (112) texture. The high coercivity may be due to not only the good texture but also the low exchange coupling as indicated by the δM peak value.

By way of comparison, a CoCrPt/NiAl/Cr/Ni₅Al₃ thin film does not show the CoCrPt (1010) and NiAl (112) peaks, as can be seen in FIG. 9. This indicates that the Cr layer does not grow result in as good an epitaxial growth onto the Ni₅Al₃ layer. As is seen in FIG. 10, the in-plane coercivity is about 1654 Oe and the δM peak intensity is about 0.2.

Having thus described particular embodiments of the present invention, those of ordinary skill in the art will recognize that many modifications and variations of the present invention may be implemented without departing from the spirit and scope of the invention as expressed in the appended claims.

What is claimed is:

1. A magnetic recording medium comprising:
   a substrate;
   a Co or Co alloy film forming a magnetic layer; and
   an underlayer comprised of a material having a Ga₃Pt₅ structure positioned between said substrate and said film.

2. The recording medium of claim 1 wherein said underlayer comprises a material selected from the group consisting of Ga₃Pt₅, Mn₃Pd₅, δGa₃Ni₅, InPt₂, and Ni₅Al₃.

3. The recording medium of claim 1 wherein said underlayer is comprised of at least two layers of said material having a Ga₃Pt₅ structure.

4. The recording medium of claim 1 wherein said underlayer is comprised of at least two layers and wherein each layer alternates between one of said material having a Ga₃Pt₅ structure and a material having a body centered cubic derivative structure.

5. The recording medium of claim 1 further comprising an overlayer disposed on said film, such that said film lies between said underlayer and said overlayer.

6. The recording medium of claim 5 further comprising an overcoat disposed on said overlayer.

7. The recording medium of claim 6 further comprising an organic lubricant disposed on said overcoat such that said overcoat lies between said lubricant and said overlayer.

8. The recording medium of claim 1 further, comprising a first intermediate layer interposed between said magnetic layer and said underlayer, wherein said first intermediate layer comprises a material selected from the group consisting of chromium, a chromium alloy and a material having a body centered cubic derivative crystalline structure.

9. The recording medium of claim 8 wherein said first intermediate layer material comprises a material selected from the group consisting of materials having a B2, DO₃ and L2₁ crystalline structure.

10. The recording medium of claim 8 wherein said first intermediate layer comprises a material selected from the group consisting of NiAl, AlCo, FeAl, FeTi, CoFe, CoTi, CoHf, CoZr, NiTi, CuBe, CuZn, AlMn, AlRe, AgMg, Mn₃Si and Al₂FeMn₂.

11. The recording medium of claim 8 further comprising a second intermediate layer interposed between said first intermediate layer and said underlayer, wherein said second intermediate layer comprises a material having a body centered cubic derivative crystalline structure.

12. The recording medium of claim 8 further comprising a third intermediate layer interposed between said first intermediate layer and said magnetic layer, wherein said third intermediate layer comprises a material having a non-magnetic hexagonal closed packed crystalline structure.

13. The recording medium of claim 8 wherein said underlayer promotes the epitaxial growth of said first intermediate layer.

14. The recording medium of claim 1 wherein said underlayer promotes the epitaxial growth of said magnetic layer.

15. The recording medium of claim 1 further comprising a first intermediate layer interposed between said magnetic layer and said underlayer to promote epitaxial crystalline growth of said magnetic layer.

16. The recording medium of claim 15 further comprising a second intermediate layer interposed between said first intermediate layer and said underlayer to promote epitaxial crystalline growth of said magnetic layer.

17. The recording medium of claim 15 further comprising a third intermediate layer interposed between said first intermediate layer and said magnetic layer to provide a transition in lattice constant values from the first intermediate layer to the magnetic layer.

18. The recording medium of claim 1 wherein said underlayer is formed from direct deposition from at least one target material.

19. The recording medium of claim 18 wherein said at least one target material comprises a single target material comprising an alloy having a 3:5 atomic composition ratio.

20. The recording medium of claim 18 wherein said at least one target material comprises a plurality of target materials comprising a material selected from the group consisting of pure elements and alloys containing elements comprising said $Ga_3Pt_5$ structured underlayer.

21. In a magnetic recording medium having a substrate, an underlayer and a Co or Co alloy magnetic layer, the improvement comprising an underlayer comprised of a material having a $Ga_3Pt_5$ structure positioned between said substrate and said magnetic layer.

22. The improvement recited in claim 21 wherein said underlayer comprises a material selected from the group consisting of $Ga_3Pt_5$, $Mn_3Pd_5$, $\delta Ga_3Ni_5$, $InPt_2$, and $Ni_5Al_3$.

23. The improvement recited in claim 21 further comprising a first intermediate layer interposed between said magnetic layer and said underlayer, wherein said first intermediate layer comprises a material selected from the group consisting of chromium, a chromium alloy and a material having a body centered cubic derivative structure.

24. The improvement recited in claim 23 further comprising a second intermediate layer interposed between said first intermediate layer and said underlayer, wherein said second intermediate layer comprises a material having a body centered cubic derivative crystalline structure.

25. The improvement recited in claim 23 further comprising a third intermediate layer interposed between said first intermediate layer and said magnetic layer, wherein said third intermediate layer comprises a material having a non-magnetic hexagonal closed packed crystalline structure.

26. The improvement recited in claim 21 wherein said underlayer is formed from direct deposition from at least one target material.

27. The improvement recited in claim 26 wherein said at least one target material comprises a single target material comprising an alloy having a 3:5 atomic composition ratio.

28. The improvement recited in claim 26 wherein said at least one target material comprises a plurality of target materials comprising a material selected from the group consisting of pure elements and alloys containing elements comprising said $Ga_3Pt_5$ structured underlayer.

29. An apparatus for data storage comprising:
a recording media comprising;
a substrate,
a Co or Co alloy film forming a magnetic layer, and
an underlayer comprised of a material having a $Ga_3Pt_5$ structure disposed between said substrate and said magnetic layer; and
a magnetic transducer positioned in close proximity to said recording media.

30. The apparatus of claim 29 wherein said material is selected from the group consisting of $Ga_3Pt_5$, $Mn_3Pd_5$, $\delta Ga_3Ni_5$, $InPt_2$, and $Ni_5Al_3$.

31. The apparatus of claim 29 wherein said recording media further comprises a first intermediate layer interposed between said magnetic layer and said underlayer, wherein said first intermediate layer comprises a material selected from the group consisting of chromium, a chromium alloy and a material having a body centered cubic derivative crystalline structure.

32. The apparatus of claim 31 wherein said recording media further comprises a second intermediate layer interposed between said first intermediate layer and said underlayer, wherein said second intermediate layer comprises a material having a body centered cubic derivative crystalline structure.

33. The apparatus of claim 31 wherein said recording media further comprises a third intermediate layer interposed between said first intermediate layer and said magnetic layer, wherein said third intermediate layer comprises a material having a non-magnetic hexagonal closed packed crystalline structure.

34. The apparatus of claim 29 wherein said underlayer is formed from direct deposition from at least one target material.

35. The apparatus of claim 34 wherein said at least one target material comprises a single target material comprising an alloy having a 3:5 atomic composition ratio.

36. The apparatus of claim 34 wherein said at least one target material comprises a plurality of target materials comprising a material selected from the group consisting of pure elements and alloys containing elements comprising said $Ga_3Pt_5$ structured underlayer.

37. A method of producing an epitaxial crystalline Co or Co alloy magnetic layer on a recording substrate, said method comprising:
applying a bias voltage of about −300V to said substrate while depositing from a target material having a body centered cubic derivative crystalline structure on said substrate to form a layer having a $Ga_3Pt_5$ crystalline structure; and
growing said Co or Co alloy magnetic layer on said material.

38. The method of claim 37 wherein said target material comprises NiAl.

39. The method of claim 37 wherein said $Ga_3Pt_5$ structured underlayer is selected from the group consisting of $Ga_3Pt_5$, $Mn_3Pd_5$, $\delta Ga_3Ni_5$, $InPt_2$, and $Ni_5Al_3$.

40. A method of producing an epitaxial crystalline Co or Co alloy magnetic layer on a recording substrate, said method comprising:
depositing, from at least one target material, an underlayer comprising a material having a $Ga_3Pt_5$ structure on said substrate; and
growing said Co or Co alloy magnetic layer on said $Ga_3Pt_5$ structure.

41. The method of claim 40 wherein said underlayer comprises a material selected from the group consisting of $Ga_3Pt_5$, $Mn_3Pd_5$, $\delta Ga_3Ni_5$, $InPt_2$, and $Ni_5Al_3$.

42. The method of claim 40 further comprising the step of interposing a first intermediate layer between said underlayer and said magnetic layer, wherein said first intermediate layer comprises a material selected from the group consisting of chromium, a chromium alloy and a material having a body centered cubic derivative crystalline structure.

43. The method of claim 42 further comprising the step of interposing a second intermediate layer between said first intermediate layer and said underlayer, wherein said second intermediate layer comprises NiAl.

44. The method of claim 42 further comprising the step of interposing a third intermediate layer between said first intermediate layer and said magnetic layer, wherein said third intermediate layer comprises a material having a non-magnetic hexagonal closed packed crystalline structure.

45. The method of claim 40 wherein said at least one target material comprises a single target material comprising an alloy having a 3:5 atomic composition ratio.

46. The method of claim 40 wherein said at least one target material comprises a plurality of target materials comprising a material selected from the group consisting of pure elements and alloys containing elements comprising said $Ga_3Pt_5$ structured underlayer.

* * * * *

UNITED STATES PATENT AND TRADEMARK OFFICE
CERTIFICATE OF CORRECTION

PATENT NO. : 6,596,417 B1
DATED : July 22, 2003
INVENTOR(S) : Hsu et al.

It is certified that error appears in the above-identified patent and that said Letters Patent is hereby corrected as shown below:

Title page,
Item [56], References Cited, OTHER PUBLICATIONS,
"M. Futamoto" reference, delete "LEEE" and substitute with -- IEEE --.
"P. Villars" reference, delete "Crystallogrpahic" and substitute with
-- Crystallographic --.
"Lee et al." reference, delete "CoCeTa" and substitute with -- CoCrTa --.
Item [57], ABSTRACT,
Line 3, delete "arid" and substitute with -- and --.

Column 2,
Lines 4 and 17, delete "1120" and substitute with -- 11$\bar{2}$0 --.
Lines 4 and 27, delete "1010" and substitute with -- 10$\bar{1}$0 --.

Column 3,
Line 18, delete "increases:for" and substitute with -- increases for --.
Lines 25 and 36, delete "1010" and substitute with -- 10$\bar{1}$0 --.

Column 4,
Line 27, delete "1010" and substitute with -- 10$\bar{1}$0 --.

Column 5,
Line 15, delete "ridge" and substitute with -- rigid --.
Lines 62 and 64, delete "1010" and substitute with -- 10$\bar{1}$0 --.

Column 8,
Lines 18, 22, 24, 25 and 46, delete "1010" and substitute with -- 10$\bar{1}$0 --.
Line 65, delete "GA$_3$PTs" and substitute with -- GA$_3$PT$_5$ --.

Column 9,
Lines 25, 26, 54 and 66, delete "1010" and substitute with -- 10$\bar{1}$0 --.
Lines 34 and 65, delete "NisAl$_3$" and substitute with -- Ni$_5$Al$_3$ --.

UNITED STATES PATENT AND TRADEMARK OFFICE
CERTIFICATE OF CORRECTION

PATENT NO.   : 6,596,417 B1
DATED        : July 22, 2003
INVENTOR(S)  : Hsu et al.

It is certified that error appears in the above-identified patent and that said Letters Patent is hereby corrected as shown below:

Column 10,
Line 7, delete "1010" and substitute with -- $10\bar{1}0$ --.

Signed and Sealed this

Thirtieth Day of May, 2006

JON W. DUDAS
*Director of the United States Patent and Trademark Office*